United States Patent [19]
Copeland

[11] 4,031,490
[45] June 21, 1977

[54] ANALOG SIGNAL PROCESSOR

[75] Inventor: Miles Alexander Copeland, Ottawa, Canada

[73] Assignee: Northern Electric Company Limited, Montreal, Canada

[22] Filed: Jan. 29, 1976

[21] Appl. No.: 653,293

[52] U.S. Cl. .............................. 333/70 T; 235/181; 307/221 D; 357/24

[51] Int. Cl.[2] ...................... H03H 7/28; G06G 7/19; H01L 29/78; H01L 29/50

[58] Field of Search ...................... 333/70 T, 70 A; 307/221 R, 221 D, 221 C; 357/24; 328/167; 235/181

[56] References Cited
UNITED STATES PATENTS

| | | | |
|---|---|---|---|
| 3,787,852 | 1/1974 | Puckette et al. | 357/24 X |
| 3,801,883 | 4/1974 | Tiemann | 357/24 X |
| 3,819,954 | 6/1974 | Butler et al. | 307/221 D |

OTHER PUBLICATIONS

Tiemann et al. "Intracell Charge-Transfer Structure for Signal Processing" in IEEE Trans. on Electron Devices, vol. ED 21, No. 5, May 1974, pp. 300–307.

Primary Examiner—Alfred F. Smith
Assistant Examiner—Marvin Nussbaum
Attorney, Agent, or Firm—John E. Mowle

[57] ABSTRACT

An analog signal processor in which the voltage is sensed across a plurality of charge storage elements to derive an output signal. With this arrangement, the effects of signal interaction encountered in charge sensing are eliminated. The processor can be readily implemented using MOS (metal-oxide-silicon) technology whereby the charge is manipulated by electronic data and stored at the surface of the semiconductor substrate. It is particularly adapted for use as a programmable cross-correlator or a transversal filter.

3 Claims, 4 Drawing Figures

ANALOG SIGNAL PROCESSOR

BACKGROUND OF THE INVENTION

This invention relates to an analog signal processor which is particularly adapted for use as a programmable cross-correlator or transversal filter that may be realized in an integrated metal-oxide-silicon (MOS) semiconductor structure.

The general area of discrete analog signal processing has been reviewed by Dennis D. Buss and Walter H. Bailey in a paper entitled: "Applications of Charge Transfer Devices to Analog Signal Processing" 1974 IEEE Inter-Con Technical Papers; Session 9, entitled: "CCDs in Analog Signal Processing," Paper 9/1. Among other circuits the authors discuss a typical transversal filter. In this realization the sampled analog signals are delayed, as for example, in a charge coupled device (CCD) delay line, and the variously delayed signals are multiplied by various tap weights and summed to achieve the filtering action. In the structure they describe, the delayed analog signals move relative to the structure, while the tap weights are applied at fixed points in the structure.

One realization of such a structure is described by Donald R. Lampe et al in a paper entitled: "An Electrically-Reprogrammable Analog Transversal Filter"; 1974 IEEE International Solid-State Circuits Conference; Session XIII, entitled: "Charge-Coupled Devices and Applications" Paper No. 13.6. In this structure, the analog tap weights are stored by combining the CCD process with the metal-nitride-oxide-silicon (MNOS) processes.

An alternative transversal filter realization is described by J.J. Tiemann et al in a paper entitled: "Intracell Charge-Transfer Structures for Signal Processing" IEEE Transactions on Electron Devices; Vol. ED-21, No. 5, May 1974 pp 300-308. In this structure the relative motion is of the tap weights moving past the stored analog signals, rather than the reverse as in the Lampe et al. structure. The analog signal is periodically sampled, and stored as charge in one of two surface potential wells. The charge is "sloshed" back and forth between the potential wells, being placed in one potential well to signify a binary tap weight 1 and in the other to signify a binary tap weight 0. The charges in the tap weight 1 potential wells are sensed by a floating electrode technique.

Because in the Tiemann et al. structure the magnitude of the surface charge is sensed, it suffers from a cross-modulation effect between signals when floating gate voltage sensing is used. In addition, the total capacitance to ground from the sensing electrode has a non-linearity caused by the depletion capacitance. With heavy capacitive loading, such cross-modulation and non-linearity effects may be suppressed by an external linear capacitance. However this reduces the output signal amplitude and hence the signal to noise ratio.

SUMMARY OF THE INVENTION

It has been found that by utilizing a novel structure which provides a floating sensing node for surface voltage rather than surface charge, the effects of signal interaction (i.e. cross-modulation), resulting in non-linearity and varying offsets of the output signal in an analog signal processor, may be eliminated. The structure of the present invention is functionally similar to that of Tiemann et al in that the tap weights are moved relative to the analog signal, but differs in that surface voltage rather than surface charge is sensed and as a result is realizable in various technologies other than CCD's.

Thus, in accordance with the present invention there is provided an analog signal processor comprising a plurality of charge storage elements each having an input signal electrode and an output sensing electrode, the input signal electrodes being separate from each other, and the output sensing electrodes being connected to each other. The processor includes a common electrode and a control means for initially coupling the input signal electrodes to a first reference potential source and the output sensing electrodes to a second reference potential source to set the electrodes to a fixed potential with respect to the common electrode. Thereafter, the control means disconnects the second reference potential source and individually connects sampled analog signal potential sources to preselected input signal electrodes to alter charge on the storage elements so as to derive an output signal voltage on the output sensing electrodes which is a function of the magnitude of the sampled analog signal potentials, and of the preselected connections of the sources to the input signal electrodes.

In a preferred embodiment, the invention is implemented using single-level MOS technology whereby charge is manipulated by electronic data and stored at the surface of the semiconductor substrate.

BRIEF DESCRIPTION OF THE DRAWINGS

Example embodiments of the invention will now be described with reference to the accompanying drawings in which.

Figure 1:
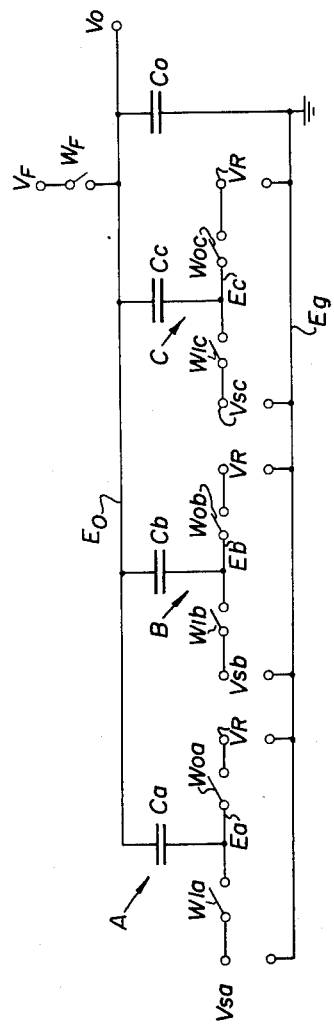
FIG. 1 is a schematic circuit diagram of a three-module analog signal processor in accordance with the present invention.

In the following detailed description of the example embodiments, basic reference characters are assigned to individual elements. Where it is necessary to distinguish between repetitive elements in a row or column, additional reference characters or numerals are added to the base character. In general, reference is made only to the base character.

Referring to FIG. 1, the basic circuit of the three module, A, B and C analog signal processor comprises three charge storage elements or capacitors $C_a$, $C_b$ and $C_c$ each having a separate input signal electrode $E_a$, $E_b$ and $E_c$ respectively, and a common output sensing electrode $E_o$. Analog signal voltages from the sampled analog signal potential sources $V_{sa}$, $V_{sb}$ and $V_{sc}$ can be connected through the separate switches $W_{1a}$, $W_{1b}$ and $W_{1c}$ to the respective input electrodes $E_a$, $E_b$ and $E_c$ of the capacitors $C_a$, $C_b$ and $C_c$. Alternately, a reference potential source $V_R$ can be connected to each of the input electrodes $E_a$, $E_b$ and $E_c$ of the capacitors $C_a$, $C_b$ or $C_c$ through the switches $W_{oa}$, $W_{ob}$ or $W_{oc}$ respectively. A further reference potential source $V_F$ can also be connected to the output sensing electrode $E_o$ through a switch $W_F$. The capacitor $C_o$ represents any additional stray capacity which may be present between the common output electrode $E_o$ and the common or ground electrode $E_g$.

In operation, preprogrammed control means (not illustrated in this Figure) momentarily close switch $W_F$ to set the common output electrode $E_o$ to the fixed potential $V_F$. This provides a reset operation. At the time of reset, all switches $W_o$ are held closed and $W_1$ open, to constrain the respective signal nodes $E_a$, $E_b$ and $E_c$ at the reference potential $V_R$ which may be at ground potential.

The sensing operation then follows. Referring to the left-hand module, for a binary tap weight 0, switch $W_{oa}$ is closed and switch $W_{1a}$ open, and no change is caused in the voltage at the signal node $E_a$. Therefore, no change is caused in the output voltage $V_c$ on the (floating) sensing node $E_o$. For a binary tap weight 1 on the other hand, switch $W_{oa}$ is opened and switch $W_{1a}$ closed, to change the voltage at signal node $E_a$ from $V_R$ to $V_{sa}$. The (floating) sensing node $E_o$ therefore receives a capacitive voltage action which is proportional to the difference between the reference voltage $V_R$ and the signal voltage $V_{sa}$. The output voltage $V_o$ if capacitive storage element $C_a$ receives a tap weight 1 and all the other tap weights are 0 is:

$$V_o = V_F + (V_{sa} - V_R)\frac{C_a}{C_T} = V_F + (\Delta V_{sa})\frac{C_a}{C_T} \quad (1)$$

where: $C_T = C_a + C_b + C_c + C_o$.

Because the signal nodes $E_a$, $E_b$ and $E_c$ are always driven from voltage sources of low internal impedance, for both tap weights 1 and tap weights 0 the total capacitance to ground is always a constant $C_T$. Thus, the signal contribution due to each module is independent of the signal contributions due to the other modules. This completely overcomes any signal interaction between modules as was experienced in the prior art where charge sensing is used.

For any general number of modules $k$, of the type illustrated in FIG. 1, the total voltage $V_o$ resulting at the sensing node $E_o$ is:

$$V_o = V_F + \frac{1}{C_T}\sum_{n}^{k}\Delta V_{sn} C_n \quad (2)$$

where: the various values of $\Delta V_{sn}$ are finite or zero depending on whether the tap weights are 1 or 0 as controlled by the switches $W_1$ and $W_0$. The multiplication and summation action required to provide a transversal filter from the structure illustrated in FIG. 1 is thus clear from equation (2). The output voltage is linearly related to the summation over all the capacitors, of the product of the capacitor value and the analog signal voltage.

Since the circuit as described in FIG. 1 senses voltages instead of charges, a charge manipulating structure such as the CCD is not required. The circuit may be realized in any linear analog technology for example with discrete components, or using the CMOS (complimentary metal-oxide-silicon) process, or the single gate-level MOS process.

Using discrete components, discrete capacitors can be utilized for charge storage elements C with the switches $W_0$, $W_1$ and $W_R$ and the analog sampling switch (not shown) being commercial analog transmission switches. Using the CMOS process, in an integrated structure, CMOS transmission gates can be used for the various switching actions. The charge storage elements C may be integrated using oxide capacitance.

Figure 2:
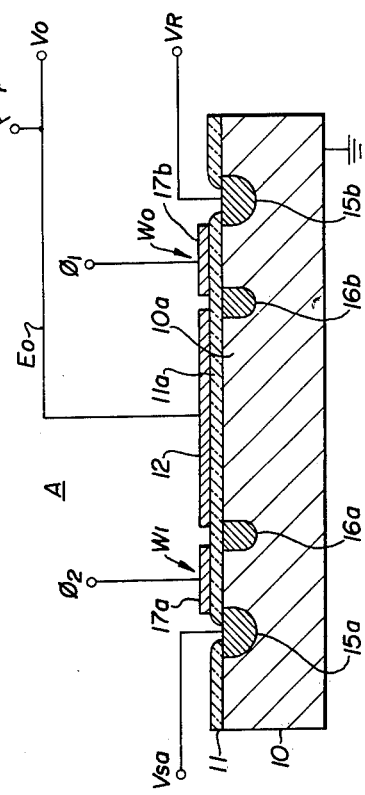
FIG. 2 is a pictorial diagram of a single module illustrated in the schematic circuit diagram of FIG. 1, implemented using single gate-level MOS technology.

FIG. 2 illustrates a particular structure of the module A for implementing the analog signal processor of FIG. 1 using a single gate-level MOS process. Referring to FIG. 2, the module A comprises a charge storage body 10 of p-type silicon having a silicon dioxide ($SiO_2$) insulating layer 11 thereover. A sensing electrode 12, disposed over the $SiO_2$ layer 11 forms the common electrode $E_o$ of a linear capacitance $C_a$ which utilizes a portion 11a of the insulating layer 11 as the dielectric and the adjacent sensing surface $10_a$ of the substrate 10 as the separate input electrode $E_a$. In this particular realization of the structure, the reset voltage $V_F$ must be high enough to allow inversion of the semiconductor surface $10a$ over the whole of the expected signal range.

Gating of the analog input signal $V_{sa}$ or the reference signals $V_R$ to the surface area $10_a$ utilizes separate signal gates $W_1$ and $W_o$ each having source diffusions $15a$, $15b$, floating transfer diffusions $16a$, $16b$ and gate electrodes $17a$, $17b$ which are connected to control voltage sources $O_2$ and $O_1$ respectively.

Figure 3:
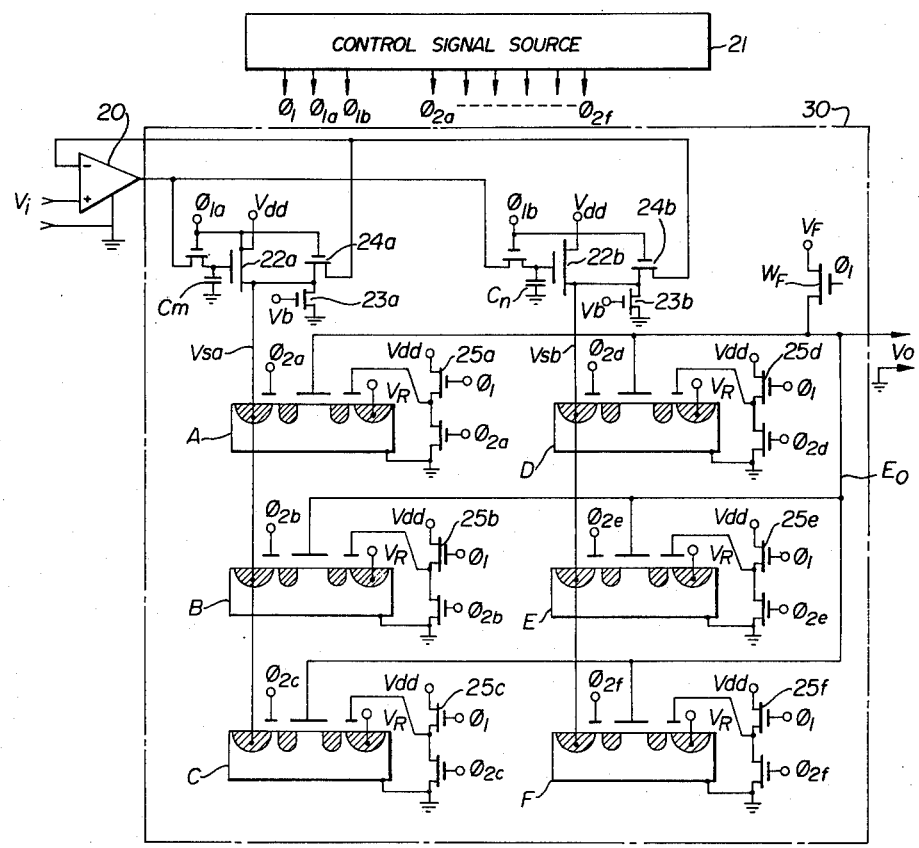
FIG. 3 illustrates a 2 × 3 matrix of modules illustrated in FIG. 2 together with the accompanying control circuitry which provides the basis for a programmable transversal filter implemented using semiconductor technology.

The operation of the module illustrated in FIG. 2 is manifest in the structure and operation of FIG. 3 which illustrates a 2 × 3 matrix of modules A, B, C, D, E and F that provides the basis for a programmable transversal filter. The groups of three basic modules A, B, C and D, E, F in the two columns represent the three most significant bits of one analog tap. Corresponding horizontal modules are all the same, i.e. their vertical extension on a common substrate will be in binary ratio, to obtain the binary-ratioed capacitances. It is noted that the particular binary-ratioed capacitors selected will be continually changing since the taps are successively stepped, say from left to right, relative to the structure. In a typical embodiment constructed on a single chip of about 150 × 150 mils, a 32 × 6 matrix as opposed to the 2 × 3 matrix illustrated in FIG. 3 would be used to provide the transversal filtering action.

In its operation, an analog input signal $V_i$ is coupled to the operational amplifier 20 which, in a typical application, is located off the chip 30. The output of the amplifier 20 is successive gated to the capacitors $C_m$ and $C_n$ under control of the signals $O_{1a}$ and $O_{1b}$ from a control signal source 21. This provides a periodic sample and hold of the incoming analog signal $V_i$. The sampled signals are then coupled through the source-followers 22 which provide the output signals $V_s$ that are coupled to each of the modules A–F. Transistors 23, which are continuously gated open by bias voltage $V_b$, provide a resistive load for the source-followers 22, while gates 24 provide negative feedback to the operational amplifier 20 during the sampling period so as to correct for the non-linearity and varying offset in the source-followers 22. The signals from the source-followers 22 drive via a common diffusion all the binary-capacitively weighted modules for one analog storage position.

Figure 4:
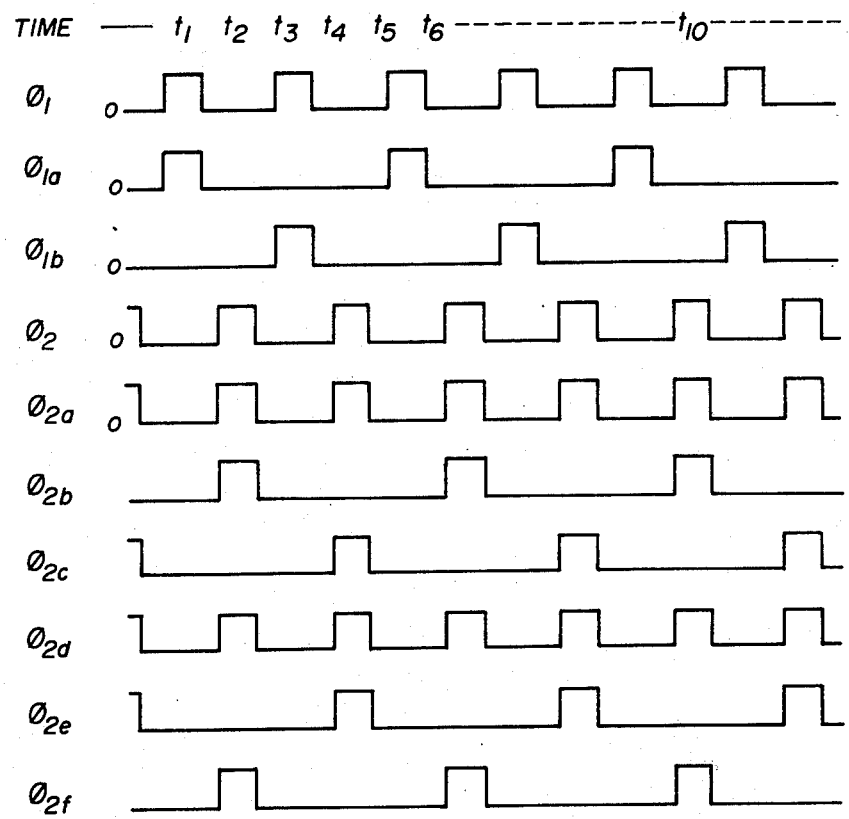
FIG. 4 illustrates typical clock waveforms used to control the simplified programmable transversal filter illustrated in FIG. 3.

Referring specifically to the control signal source 21 and FIG. 4, control voltages $O_1$ and $O_2$ are two-phase non-overlapping clocks. Clock voltages $O_{1a}$ and $O_{1b}$ alternate in synchronism with $O_1$, while clock voltages $O_{2a}$ to $O_{2f}$ control the application of tap weights to the modules A to F respectively.

Initially at time $t_1$, the analog signal $V_i$ is gated through to the hold capacitor $C_m$ under control of the clock $O_{1a}$. At the same time, the sensing electrode $E_o$ connected in common across the whole chip 30, is reset unconditionally to $V_F$ by the clock $O_1$ which is applied to gate $W_F$, while the reference voltage $V_R$ is also gated onto the sensing surface unconditionally by the clock $O_1$ which is applied to the gates 25a-25f associated with each of the modules A-F.

The digital (binary) tap weight signals are now applied conditionally (time $t_2$), to the $W_1$ electrodes (see FIG. 2) under control of the clocks $O_{2a} - O_{2f}$ from the control signal source 21. In the example embodiment, a tap weighting of 110 is initially applied at time $t_2$ to the left-hand column of modules A, B and C. Thereafter, this weighting is transferred to the right-hand column of modules D, E and F and replaced by a tap weighting of 101 at time $t_4$. Also at time $t_2$, a tap weighting of 101 is applied to the right-hand column of modules D, E and F. If a shift register structure is used in the control source 21 to carry the tap weight information, the weighting 101 at time $t_4$ will again shift to the right-hand column (modules D, E and F) and be replaced by a tap weighting 110 in the left-hand column (modules A, B and C) at time $t_6$. It will be evident that these tap weightings are exemplary only and are selected in accordance with the requirements of the particular transversal filter. The load transistors 23 assure a fast enough time constant that the sensing surfaces (see 10a of FIG. 2) are constrained in voltage (reach steady state) during the application of the clocks $O_2$. It can be seen that for those modules where the sampled analog signal $V_s$ is gated through to the sensing surface from the left, by clocks $O_{2a} - O_{2f}$ the same clocks short the $W_0$ electrode to ground, isolating the sensing surface from the reference voltage $V_R$. If $O_{2a}-O_{2f}$ is zero, the reference voltage $V_R$ continues to be gated through the sensing surface during the clock $O_2$, to maintain the surface voltage constraint for tap weight "O". During the clock interval $t_2$, a summation of the voltages $V_o$ appears on the common sensing electrode $E_o$.

During the time interval $t_3$ of FIG. 4, the sampled analog signal voltage $V_1$ is gated onto the hold capacitor $C_n$ and the sensing electrode $E_o$ is reset. During time interval $t_4$, a tap weight 110 is applied to the modules D, E, F while a tap weight 101 is applied to modules A, B and C respectively and summation is again obtained on the sensing electrode $E_o$. These tap weights would be recirculated on the chip 30 under control of digital shift registers (not shown) located in the control signal source 21. The whole operation is again repeated commencing at time $t_5$ with the digital tap signal moving past the respective analog storage capacitors.

Due to the large capacitance of the common output sensing electrode $E_o$, the output signal $V_o$ can be obtained directly off the chip 30 without an output amplifier. This allows modularity in the use of this chip since several of the outputs can be connected in parallel. For negative tap weights, a similar chip can be used with its output voltage $V_o$ fed into the negative side of an operational amplifier acting in a differential mode to accomplish the inversion. For more bits of D/A resolution in the analog tap weights, an additional parallel chip could be used with its output voltage multiplied off-chip in appropriate binary ratio, then summed with the output of the first chip.

Alternately, with a reference voltage $V_R$ = input d-c bias, the reference signal $V_R$ would be derived from the same d-c voltage which biased the input analog signal. In this mode, any drift of the input bias would be cancelled; also any input noise up to frequencies somewhat below the analog sampling rate. For this mode, a reset action which goes on and off ($O_1$ clock) would be necessary to leave the sensing electrode floating. This is because the sensing surface would be called on to move both ways from the reference potential. Some reset (Nyquist) noise could then be expected at the output.

For $V_R$ = ground, all voltage swings caused on the sensing electrode $E_o$ are positive from the reset value. Thus a novel output circuit is possible. Referring to the FET switch $W_F$ in FIG. 3, a source-follower-like action can be set up with the sensing electrode $E_o$ constituting a capacitance load on the source-follower (note that the "source-follower" is not here being used as an amplifier). The sensing electrode $E_o$ would be resistively loaded by a resistance (not shown) off-chip, for example by the input resistance of the off-chip signal amplifier. A fixed d-c level on the input of the "source-follower" instead of $O_1$ as shown would set a fixed reference level for the sensing electrode $E_o$, from which positive voltage swings would start. Any positive swing from the fixed reference level is in the direction of slow dynamic source-follower behaviour, so the capacitive output swing is not degraded. Subsequently $O_1$ on brings all sensing surfaces to ground, and thus brings the sensing electrode 12 back to the reset level. The output is thus maintained at the required reference level between signals without the need for a reset clock. This will therefore eliminate output noise associated with the reset clock.

I claim:

1. A signal processor comprising:
    a plurality of charge storage elements each having an input signal electrode and an output sensing electrode, the input signal electrodes being separated from each other and the output sensing electrodes being connected to each other;
    a common electrode;
    a control means for initially coupling the input signal electrodes to a first reference potential source and the output sensing electrodes to a second reference potential source to set the electrodes to a fixed potential with respect to the common electrode;
    the control means thereafter disconnects the second reference potential source from the output sensing electrodes, selectively disconnects the first reference potential source from preselected input signal electrodes, and connects sampled analog signal potential sources to said preselected input signal electrodes to alter the voltage on the storage elements so as to derive an output signal voltage on the output sensing electrodes which is a function of the magnitude of the sampled analog signal potentials and of the preselected connections of the sources to the input signal electrodes.

2. A signal processor comprising:
    a plurality of charge storage elements each having an input signal electrode and an output sensing electrode, the input signal electrodes being separated from each other and the output sensing electrodes being connected to each other;
    a common electrode;

each storage element having associated therewith a first switch and a second switch for connecting respectively either a first reference potential source or a sample of an analog signal potential source to their input signal electrodes;

a third switch for connecting a second reference potential source to the output sensing electrodes; and a control means for initially closing the first and third switches to set the voltage on the storage elements with respect to the common electrode; the control means thereafter opens the third switch, and selectively closes and opens associated first and second switches respectively to alter the voltage on selected storage elements, so as to derive an output signal voltage on the output sensing electrodes which is a function of the sampled analog signal potentials, and of the closure of either said first or second switches.

3. A signal processor comprising:

a semiconductor substrate of one conductivity type;

an insulating layer disposed on a surface of said substrate;

a plurality of sensing electrodes disposed on the insulating layer and connected in common;

each sensing electrode having associated therewith;

first and second source regions and first and second floating regions disposed on the surface of said substrate and of opposite conductivity type thereto, the floating regions being in juxtaposition with their associated sensing electrodes for transferring charge therebeneath;

a first gate electrode disposed on the insulating layer in juxtaposition with the first regions, and a second gate electrode disposed on the insulating layer in juxtaposition with the second regions; each of the gate electrodes for controlling the transfer of charge from its source region to its floating region along a channel formed in the substrate in response to a gating control voltage applied thereto; each of the first source regions being connected to sampled analog signal sources, each of the second source regions being connected to a first reference potential source;

control means for initially connecting a second reference potential source to said common sensing electrodes, and for applying the gating control voltage to each of the second gate electrodes to set the surface potential on the substrate beneath the sensing electrodes to the first reference potential;

the control means thereafter disconnects the second reference potential source, and switches the gating control voltages from selected ones of the second gate electrodes to their adjacent first gate electrodes to alter the surface potential on the substrate beneath the sensing electrodes to the sampled analog signal potential;

so as to derive an output signal voltage on the common sensing electrodes which is a function of the sampled analog signal potentials and the application of the gating control voltages to either said first or second gate electrodes.

* * * * *